(12) United States Patent
Gerhard et al.

(10) Patent No.: US 7,609,116 B2
(45) Date of Patent: Oct. 27, 2009

(54) INTEGRATED AMPLIFIER ARRANGEMENT

(75) Inventors: Gregor Gerhard, Krefeld-Oppum (DE); Stefan Kern, Waghäusel (DE); Stefan Koch, Oppenweiler (DE)

(73) Assignee: Ericsson AB, Stockholm (SE)

( * ) Notice: Subject to any disclaimer, the term of this patent is extended or adjusted under 35 U.S.C. 154(b) by 15 days.

(21) Appl. No.: 10/547,288

(22) PCT Filed: Jan. 30, 2004

(86) PCT No.: PCT/IB2004/000744

§ 371 (c)(1),
(2), (4) Date: Feb. 27, 2006

(87) PCT Pub. No.: WO2004/077663

PCT Pub. Date: Sep. 10, 2004

(65) Prior Publication Data

US 2006/0208797 A1    Sep. 21, 2006

(30) Foreign Application Priority Data

Feb. 27, 2003   (DE) ................................ 103 08 848

(51) Int. Cl.
*H03F 3/28* (2006.01)
(52) U.S. Cl. ................... 330/307; 330/144; 330/145; 330/284; 333/81 R
(58) Field of Classification Search ............. 330/144, 330/145, 284, 307, 123.123; 333/81 R
See application file for complete search history.

(56) References Cited

U.S. PATENT DOCUMENTS

| 5,349,312 | A | 9/1994 | Huettner et al. |
| 5,606,283 | A | 2/1997 | Allen et al. |
| 6,798,286 | B2* | 9/2004 | Dauphinee et al. .......... 330/129 |

FOREIGN PATENT DOCUMENTS

EP    1 059 727 A2    12/2000

OTHER PUBLICATIONS

*Multifunction Chip Set For T/R Module Receive Path*, D. Willems, et al., IEEE, May 7, 1990, , Seiten 95-98, Absatz Design!; p. 1.
*A Temperature Compensated L-band Variable Gain Amplifier With Eight Bit Digital Control*, IEEE, Nov. 6, 1988, Seiten 281-284, pp. 1, 5.
*X-Band GaAs MMCI size Reduction And Integration*, E. L. Griffin, Microwave Symposium Digest, 2000 IEEE MTT-S International, Boston, MA, Jun. 2000, pp. 709-712.
*A Versatile Vector Modulator Design for MMIC*, L. M. Devlin, et al, IEEE, May 8, 1990, pp. 519-521.
*A Multicarrier Amplifier Design Linearized Trough Second Harmonies and Second-Order IM Feedback*, IEEE, Sep. 19, 2001, pp. 297-300.
*A Quasioptical Monolithic Monopulse Receiver Array*, R. L. Gingras, et al., Apr. 20, 1993, Radar Conference, 1993, Record of the 1993 IEEE National Lynnfield, MA, pp. 84-87.

* cited by examiner

*Primary Examiner*—Michael B Shingleton
(74) *Attorney, Agent, or Firm*—Kirschstein, et al.

(57) ABSTRACT

A millimetric-wave amplifier arrangement comprises a first amplifier whose output is connected to one input of the second amplifier via an adjustable attenuator. Both amplifiers are integrated on a single substrate.

5 Claims, 3 Drawing Sheets

INTEGRATED AMPLIFIER ARRANGEMENT

Figure 1:
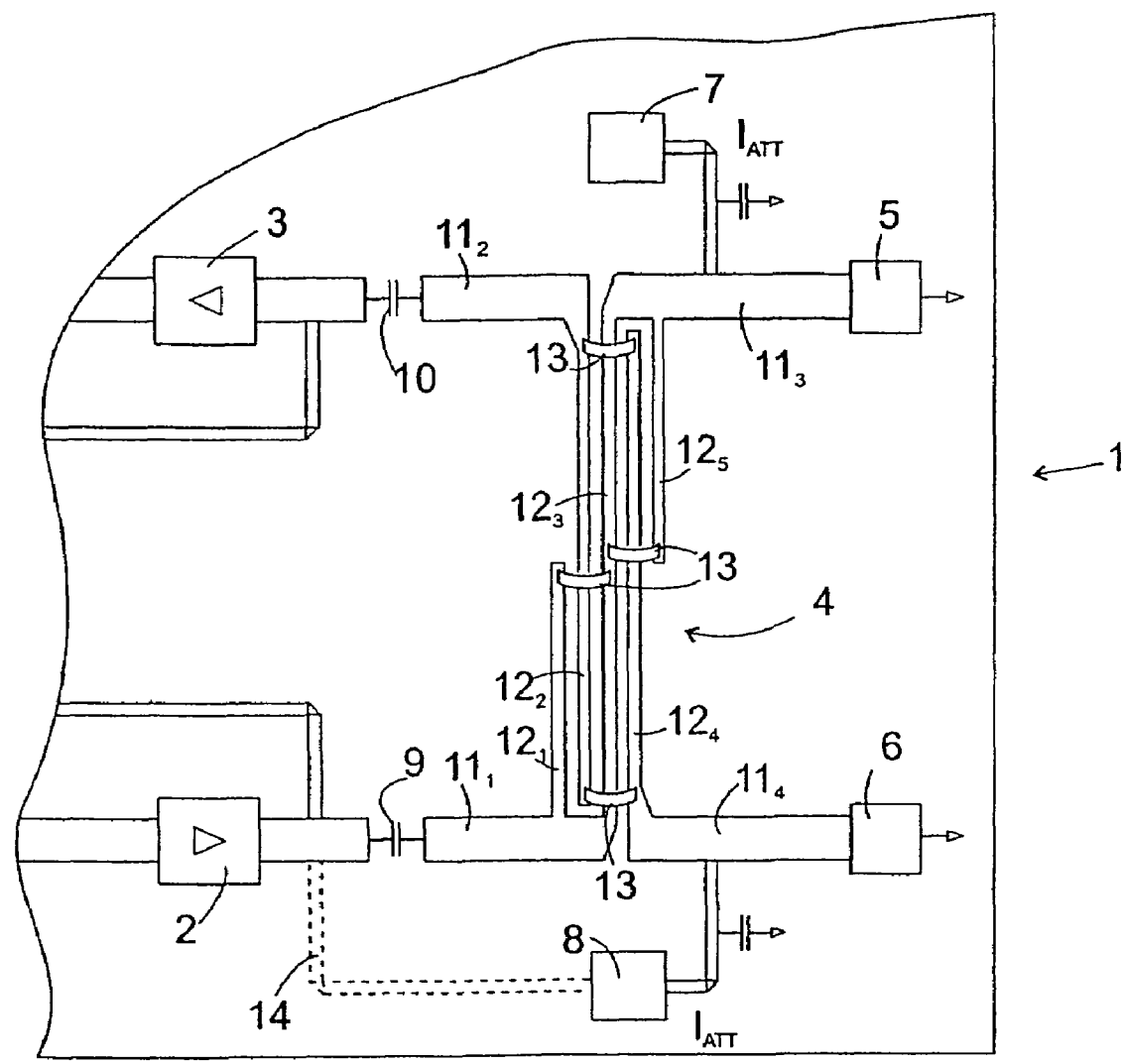

The present invention concerns an integrated amplifier arrangement for high frequency signals in the millimeter wave range.

Monolithically integrated millimeter wave amplifiers are known in a one-stage and two-stage form, i.e., in the form of two one-stage amplifiers connected in series on a common substrate. Two-stage amplifiers are used when amplification that cannot be easily achieved with one stage amplifiers is necessary. However, relative to one-stage amplifiers they have the drawback that the signal level range in which amplification is possible with sufficient linearity is smaller than in a one-stage amplifier, since a signal that is amplified with good quality by one-stage amplifier or the first stage of a two-stage amplifier can easily reach a level that leads to saturation of the second amplifier stage. For applications in which this hazard exists, hybrid circuits are therefore ordinarily used, which are constructed from a first and second amplifier, each integrated on its own substrate, and a controllable attenuator inserted in between, which serves to throttle the level of the output signal of the first amplifier stage, if necessary, far enough so that sufficiently linear amplification is again possible in the second amplifier stage.

Such hybrid circuits require considerable circuit board space because of the large number of discrete components. In addition, their manufacture is demanding and costly, since placement and bonding of these discrete components must occur with high precision in order to achieve the desired properties of the finished amplifier.

The task of the present invention is to devise an integrated millimeter wave amplifier arrangement that permits amplification of input signals with good linearity over a large level range and is simply, cost effective, and space-saving in application.

The task is solved according to the invention in that in a millimeter wave amplifier arrangement with two amplifiers integrated on a common substrate, one output of the first amplifier is connected to an output of the second amplifier via a controllable attenuator.

If this controllable attenuator is integrated together with the amplifiers on the same substrate, any problems of placement of the amplifiers and attenuator relative to each other are eliminated, since their position relative to each other is reproducibly stipulated by a mask used for production. If the controllable attenuator is formed on a different substrate than the amplifier, the problems during placement are also reduced, since only two substrates still need be positioned relative to each other and not free in the usual manner.

The controllable attenuator preferably includes a four-port interdigital coupler, generally also referred to as a Lange coupler, which is integrated with the amplifiers on the same substrate and has a first port connected to the output of the first amplifier and a second port connected to the input of the second amplifier.

The controllable attenuator also preferably includes controllable resistors connected to a third and fourth port of Lange coupler. These controllable resistors can be integrated on the same substrate as the amplifiers; however, they can also be situated on a different substrate so that different production techniques can be used for the amplifiers and for the controllable resistors.

In the latter case controllable resistors are preferably connected to the third and fourth ports of the Lange coupler via conducting air bridges.

PIN diodes or FETs are considered in particular as controllable resistors.

The resistance value of these controllable resistors is controlled by means of a control voltage, a dc voltage in the forward direction in PIN diodes and a gate-source voltage in FETs. At least one dc source to supply this control voltage is preferably integrated with the amplifier on the substrate. This dc source can be a control circuit that receives the output signal of the first amplifier or the input signal of the second amplifier and fixes the dc voltage level with reference to the signal level of this received signal.

A Lange coupler which is transmitting for a dc voltage between all of its four ports is preferably used in the amplifier arrangement according to the invention. In this case a single dc voltage source is sufficient to supply both controllable resistors with the control voltage.

In order to decouple the first and/or second amplifier from the control voltage of the dc voltage source, a capacitor is preferably arranged between the output of the first amplifier and/or the input of the second amplifier and the corresponding port of the Lange coupler.

Figure 2:
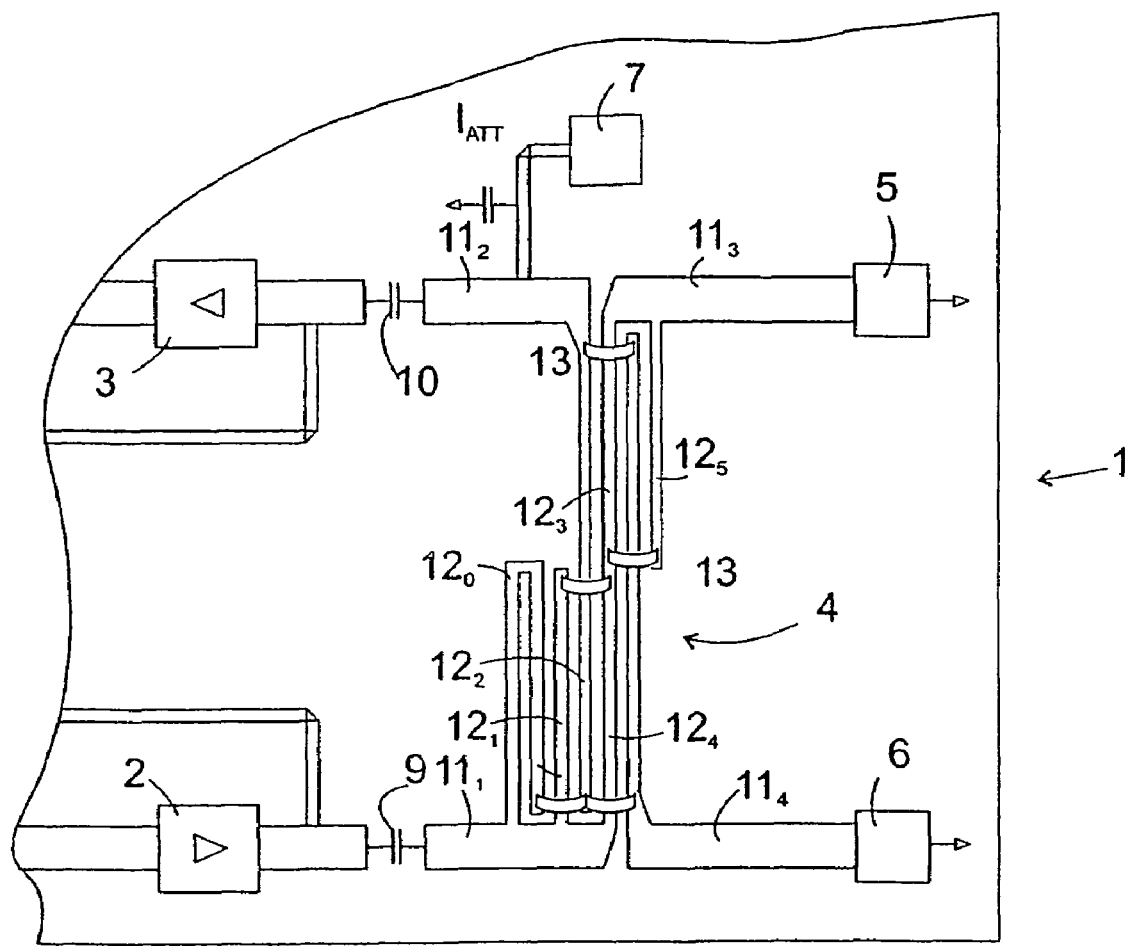
Figure 3:
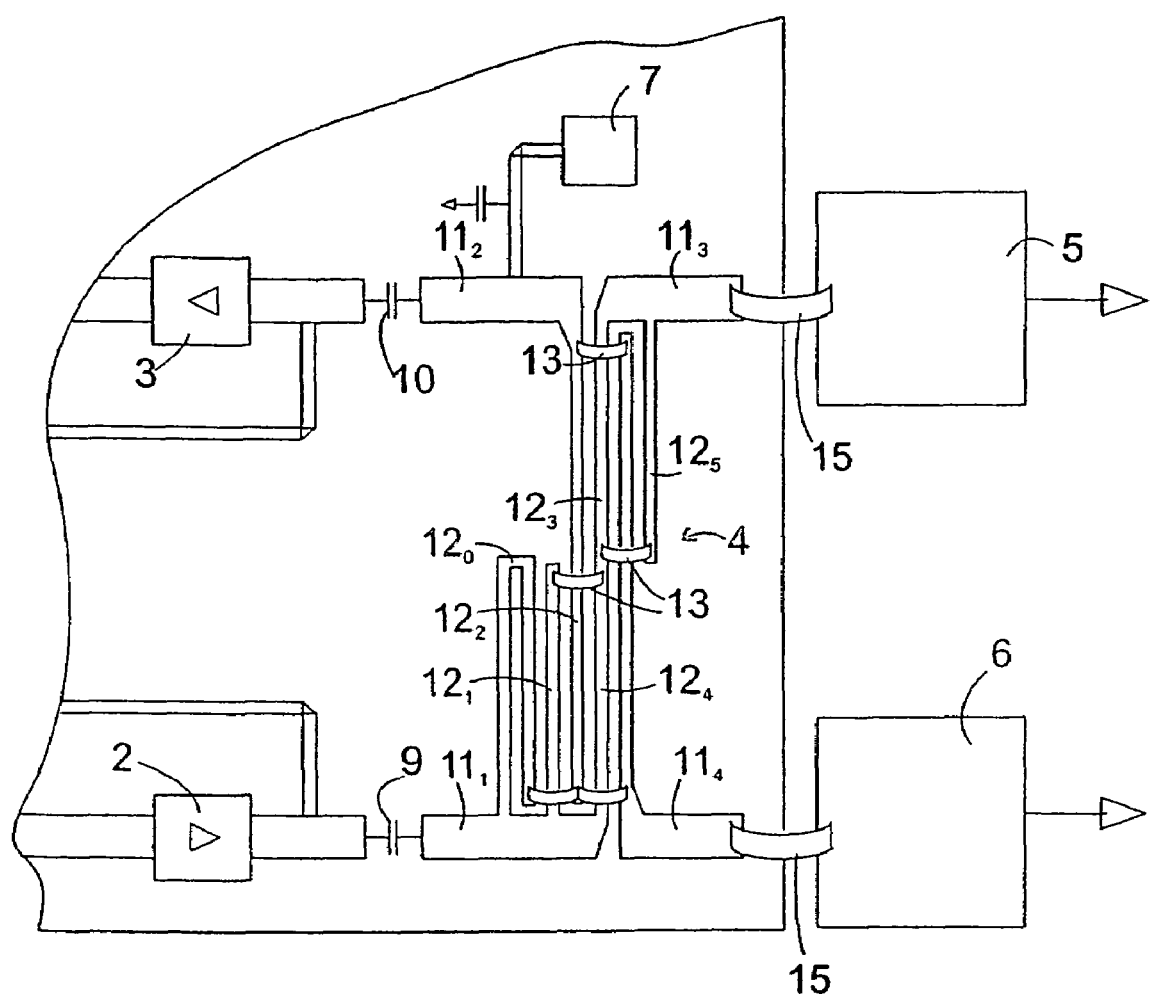

Additional features and advantages of the invention are apparent from the following description of the practical examples with reference to the accompanying figures. In the figures:

FIG. 1 schematically depicts a chip layout according to the first practical example of the invention;

FIG. 2 shows an example for a chip layout according to the second embodiment of the invention; and FIG. 3 shows an example for a chip layout according to the third embodiment of the invention.

The following are patterned on a semiconductor substrate 1 depicted as a cutout in FIG. 1: first amplifier 2, second amplifier 3, a Lange coupler 4, two controllable resistors 5, 6 and two control circuits 7, 8.

One input of the first amplifier 2 is connected to a source (not shown) for a millimeter wave signal being amplified, which can lie outside of the semiconductor substrate 1. The output of amplifier 2 is connected via a capacitor 9 to a first port $11_1$ of the Lange coupler. The Lange coupler includes five parallel printed conductors $12_1, 12_2, \ldots, 12_5$. The middle printed conductor $12_3$ represents a galvanic connection between port $11_1$ and a diagonally opposite port $11_3$. It is connected in the center via air bridges 13 to the next adjacent printed conductors $12_1$, $12_5$ emerging from ports $11_1$ and $11_3$. Printed conductors $12_2$, $12_4$ extending on both sides of printed conductor $12_3$ each emerge from ports $11_2$ and $11_4$ and are also connected on their ends by air bridges 13.

The input of the second amplifier 3 is connected to the second port $11_2$ via a capacitor 10. A controllable resistor 5 and 6 and a control circuit 7 and 8 connected to it are connected to ports $11_3$, $11_4$. The control circuits 7, 8 are constructed identically and connected to the same input signal. This input signal, as shown by the dashed connection 14, can be derived from the output of the first amplifier 2 so that the control circuits 7, 8 produce an attenuation current $I_{ATT}$ to the controllable resistors 5, 6, which is stipulated as a function of the output level of the first amplifier 2 so that the input signal of the second amplifier 3 always lies reliably in this linear range.

The controllable resistances 5, 6 are implemented as PIN diodes here, each of which has an electrode connected to ground and which are traversed in the forward direction by the attenuation current $I_{ATT}$. As an alternative, an implementation in the form of field effect transistors would also be possible, with current running through drain and source current between the connected port $11_3$ or $11_4$ of the Lange coupler and ground, and with a resistor controlled by a voltage applied to the gate of the FET by the control circuit 7 or 8.

FIG. 2 shows a further developed embodiment of the amplifier arrangement according to the invention. Elements of this arrangement that correspond to elements already described with reference to FIG. 1 have the same reference numbers and are not described again.

The difference between this embodiment and that of FIG. 1 is an additional line $12_0$ of the Lange coupler 4. The printed conductor $12_0$ emerging from port $11_1$ is twice as long as the printed conductor $12_1$ adjacent to it, but is folded back on half its length so that the tip of printed conductor $12_0$ lies in the immediate vicinity of port $11_1$. This tip is connected via an additional air bridge 13 to the tip of the printed conductor $12_2$ emerging from port $11_2$. This additional air bridge 13 guarantees a galvanic connection between all four ports of the Lange coupler 4. A single control circuit 7 is therefore sufficient to produce an attenuation current $I_{ATT}$ with which both controllable resistors 5, 6 are supplied. The control circuit 7 is connected here to port $11_2$ so that the control current to both controllable resistors 5, 6 must flow through at least one of the printed conductors of the Lange coupler. The printed conductors of the Lange coupler 4 therefore form a series resistance for the attenuation current $I_{ATT}$ in series with the controllable resistance 5, 6, but which leads to no asymmetry in the behavior of the controllable resistors since it is essentially the same for both controllable resistors 5, 6. Such asymmetry can occur if the control circuit 7 were to be directly connected to one of the ports $11_3$, $11_4$.

The practical example of FIG. 3 differs from that of FIG. 2 in that the controllable resistors 6, 7 here are implemented outside of the semiconductor substrate 1 as separate components, and are connected to the corresponding ports $11_3$, $11_4$ of the Lange coupler 4 via air bridges 15. This embodiment permits different production technologies to be used to produce the controllable resistors than for amplifiers 2, 3 and Lange coupler 4. Since the Lange coupler 4 is integrated together with the amplifiers 2, 3 on the same substrate 1, phase shifts of the signal being amplified can be controlled precisely between the two amplifiers 2, 3 and are uniform for all amplifiers of a series, since they are stipulated by the structure of the employed mask.

The invention claimed is:

1. A millimeter wave amplifier arrangement, comprising: first and second amplifiers integrated on a common substrate, the first amplifier having an output connected to an input of the second amplifier via a controllable attenuator, the controllable attenuator including a Lange coupler having one port connected to the output of the first amplifier, and an additional port connected to the input of the second amplifier, the Lange coupler being integrated with the amplifiers on the common substrate, the controllable attenuator also including controllable resistors arranged outside of the common substrate and connected to a third and a fourth port of the Lange coupler via conducting air bridges, the controllable resistors being controlled by a single control circuit connected to the additional port of the Lange coupler.

2. The millimeter wave amplifier arrangement according to claim 1, in that the controllable resistors are formed by PIN diodes or field effect transistors.

3. The millimeter wave amplifier arrangement according to claim 1, in that one voltage source is integrated on the common substrate to deliver a control voltage for the controllable resistors.

4. The millimeter wave amplifier arrangement according to claim 3, in that the Lange coupler conducts the control voltage between all ports of the Lange coupler, and in that the one voltage source supplies the control voltage to both controllable resistors.

5. The millimeter wave amplifier arrangement according to claim 4, in that at least one of the output of the first amplifier and the input of the second amplifier is connected to a corresponding port of the Lange coupler via a capacitor.

* * * * *